United States Patent
Nakagawa et al.

(10) Patent No.: US 8,786,031 B2
(45) Date of Patent: Jul. 22, 2014

(54) METAL NITRIDE FILM, SEMICONDUCTOR DEVICE USING THE METAL NITRIDE FILM, AND MANUFACTURING METHOD OF SEMICONDUCTOR DEVICE

(75) Inventors: Takashi Nakagawa, Hachioji (JP); Naomu Kitano, Machida (JP)

(73) Assignee: Canon Anelva Corporation, Kawasaki-shi (JP)

( * ) Notice: Subject to any disclaimer, the term of this patent is extended or adjusted under 35 U.S.C. 154(b) by 136 days.

(21) Appl. No.: 13/036,664

(22) Filed: Feb. 28, 2011

(65) Prior Publication Data
US 2011/0210405 A1 Sep. 1, 2011

(30) Foreign Application Priority Data
Mar. 1, 2010 (JP) ................................ 2010-043661

(51) Int. Cl.
H01L 21/02 (2006.01)
H01L 21/44 (2006.01)

(52) U.S. Cl.
USPC .......................................... 257/411; 438/685

(58) Field of Classification Search
USPC ............................ 257/411, E29.16; 438/685
See application file for complete search history.

(56) References Cited

U.S. PATENT DOCUMENTS

| | | |
|---|---|---|
| 6,358,789 B2 | 3/2002 | Lee |
| 6,423,619 B1 | 7/2002 | Grant et al. |
| 6,506,676 B2 * | 1/2003 | Park et al. ..................... 438/683 |
| 6,642,132 B2 | 11/2003 | Cho et al. |
| 6,768,179 B2 | 7/2004 | Cho et al. |
| 6,982,467 B2 | 1/2006 | Koyama et al. |
| 7,075,158 B2 | 7/2006 | Koyama et al. |
| 7,126,199 B2 | 10/2006 | Doczy et al. |
| 7,351,628 B2 | 4/2008 | Forbes et al. |
| 7,718,496 B2 | 5/2010 | Frank et al. |
| 7,781,230 B2 | 8/2010 | Odagawa et al. |
| 7,820,476 B2 | 10/2010 | Nakajima ...................... 438/99 |
| 7,867,847 B2 | 1/2011 | Kitano et al. |
| 7,923,360 B2 | 4/2011 | Kitagawa et al. |
| 8,110,491 B2 | 2/2012 | Harada |

(Continued)

FOREIGN PATENT DOCUMENTS

JP  9-67671 A  3/1997
JP  10-209084 A  8/1998

(Continued)

OTHER PUBLICATIONS

Korean Office Action issued in Appln. No. 10-2011-0018512 (dated Dec. 27, 2012) (10 pages).

(Continued)

Primary Examiner — Matthew Landau
Assistant Examiner — Igwe U Anya
(74) Attorney, Agent, or Firm — Fitzpatrick, Cella, Harper & Scinto (57) ABSTRACT

The present invention provides a metal nitride film that realizes an intended effective work function (for example, a high effective work function) and has EOT exhibiting no change or a reduced change, a semiconductor device using the metal nitride film, and a manufacturing method of the semiconductor device. The metal nitride film according to an embodiment of the present invention contains Ti, Al and N, wherein the metal nitride film has such molar fractions of Ti, Al and N as (N/(Ti+Al+N)) of 0.53 or more, (Ti/(Ti+Al+N)) of 0.32 or less, and (Al/(Ti+Al+N)) of 0.15 or less.

10 Claims, 6 Drawing Sheets

(56) References Cited

U.S. PATENT DOCUMENTS

| | | | |
|---|---|---|---|
| 8,212,322 B2 | 7/2012 | Frank et al. | |
| 8,492,258 B2 | 7/2013 | Harada | |
| 8,680,623 B2 | 3/2014 | Frank et al. | |
| 2001/0005609 A1 | 6/2001 | Lee | |
| 2002/0001906 A1* | 1/2002 | Park | 438/287 |
| 2002/0094652 A1* | 7/2002 | Akram et al. | 438/301 |
| 2004/0036129 A1 | 2/2004 | Forbes et al. | |
| 2004/0132272 A1* | 7/2004 | Ku et al. | 438/585 |
| 2004/0140513 A1 | 7/2004 | Forbes et al. | |
| 2005/0088889 A1* | 4/2005 | Lee et al. | 365/202 |
| 2005/0179097 A1 | 8/2005 | Forbes et al. | |
| 2007/0179097 A1* | 8/2007 | Furuya et al. | 514/15 |
| 2007/0240995 A1* | 10/2007 | Odagawa et al. | 205/183 |
| 2007/0246832 A1* | 10/2007 | Odagawa et al. | 257/763 |
| 2008/0121999 A1 | 5/2008 | Kawahara et al. | 257/366 |
| 2008/0272433 A1* | 11/2008 | Alshareef et al. | 257/347 |
| 2009/0098693 A1* | 4/2009 | Nakajima | 438/199 |
| 2009/0170344 A1 | 7/2009 | Fukuchi et al. | |
| 2010/0120238 A1 | 5/2010 | Kitano et al. | |
| 2010/0133092 A1 | 6/2010 | Mashimo et al. | |
| 2010/0244192 A1 | 9/2010 | Nakagawa et al. | |
| 2010/0330813 A1 | 12/2010 | Nakagawa et al. | |
| 2011/0027979 A1 | 2/2011 | Seino et al. | |
| 2011/0064642 A1 | 3/2011 | Kitano et al. | |
| 2011/0156128 A1 | 6/2011 | Ono et al. | |
| 2012/0038009 A1* | 2/2012 | Toh et al. | 257/411 |
| 2012/0193716 A1* | 8/2012 | Frank | 257/347 |

FOREIGN PATENT DOCUMENTS

| | | | |
|---|---|---|---|
| JP | 2002-26319 | A | 1/2002 |
| JP | 2002-252285 | A | 9/2002 |
| JP | 2003-142601 | A | 5/2003 |
| JP | 2003-201560 | A | 7/2003 |
| JP | 2004-214530 | A | 7/2004 |
| JP | 2005-5603 | | 1/2005 |
| JP | 2005-536877 | A | 2/2005 |
| JP | 2005-512326 | A | 4/2005 |
| JP | 2007-287761 | A | 11/2007 |
| JP | 2008-016538 | A | 1/2008 |
| JP | 2008-515190 | A | 5/2008 |
| JP | 2009-099747 | A | 5/2009 |
| JP | 2009-141040 | A | 6/2009 |
| JP | 2010-034511 | A | 2/2010 |
| JP | 2011-501450 | A | 1/2011 |
| KR | 2001-0064099 | A | 7/2001 |
| KR | 10-0368311 | B1 | 1/2003 |
| WO | 2009/056417 | A1 | 5/2009 |

OTHER PUBLICATIONS

Korean Office Action issued in 10-2011-0018512 (issued Jun. 13, 2012) (8 pages).

Office Action issued in Japanese Patent Application No. 2010-253647, dated May 1, 2014 (4 pages).

* cited by examiner

METAL NITRIDE FILM, SEMICONDUCTOR DEVICE USING THE METAL NITRIDE FILM, AND MANUFACTURING METHOD OF SEMICONDUCTOR DEVICE

BACKGROUND OF THE INVENTION

1. Field of the Invention

The present invention relates to a metal nitride film, a semiconductor device using the metal nitride film and the manufacturing method of the semiconductor device, more particularly to a metal nitride film usable for metal gate electrodes, a semiconductor device having a high permittivity insulating film and a metal nitride film as a metal gate electrode, and the manufacturing method of the semiconductor device. Moreover, the present invention relates to a technology for attaining high performance of semiconductor devices, for example, such as MOSFETs (Metal Oxide Semiconductor Field Transistor).

2. Description of the Related Art

In the leading-edge CMOS (complementary MOS) device development, in which the miniaturization of transistors advances, there are such problems as the deterioration of drive current due to the depletion of a polysilicon (Poly-Si) electrode, and the increase in gate current due to thinning in a gate insulating film. Accordingly, a composite technology is examined, in which a metal gate is applied to avoid the depletion of the electrode, and, at the same time, gate leak current is reduced by thickening a physical film thickness using a high permittivity material as the gate insulating film. As the material for use in the metal gate electrode, pure metals, metal nitrides, silicide materials, etc. are examined, wherein, in all cases, the threshold voltage (Vth) of N-type MOSFETs and P-type MOSFETs must be able to be set to a suitable value. When a conventional gate electrode via a polycrystalline silicon film is used, the threshold voltage of the transistor is determined by the impurity concentration in the channel region and the impurity concentration in the polycrystalline silicon film. On the other hand, when the metal gate electrode is used, the threshold voltage of the transistor is determined by the impurity concentration in the channel region and the work function of the gate electrode. In order to actualize a Vth of ±0.5 V or less in CMOS transistors, for N-type MOSFETs, it is necessary to use a material having a work function of the Si mid gap (4.6 eV) or less, desirably 4.4 eV or less. On the other hand, for P-type MOSFETs, it is necessary to use a material having the work function of the Si mid gap (4.6 eV) or more, desirably 4.8 eV or more as the gate electrode.

As a means for realizing these, a Metal-inserted Poly-silicon Stack (MIPS) having a high consistency with existing CMOS production processes is examined. In the method, a gate electrode having a metal film inserted between Poly-Si and the gate insulating film is formed, and the threshold voltage is adjusted by the work function of the inserted gate electrode. At this time, there is such a problem that the work function of the metal film varies by the cross reaction with the gate insulating film or the poly-silicon in a heat treating process.

For example, Japanese Patent Application Laid-open Publication No. 2008-16538 discloses a method using a gate electrode including a laminate structure of polycrystalline silicon, PVD-TiN (second metal layer) and CVD-TiN (first metal layer). It describes that the method can actualize TiN having a work function of 4.8 eV or more that is suitable for the metal gate of P-type MOSFETs by forming TiN being the first metal layer by a thermal CVD method using $TiCl_4$ and $NH_3$ at a low temperature of 450° C. or less. Moreover, it describes that TiN oriented toward a (100) plane is formed by forming TiN being the second metal layer at 500° C. (a temperature higher than that for forming TiN of the first metal layer) by a PVD method. There is such description that the TiN oriented toward a (100) plane has an effect of suppressing the lowering of the work function due to the diffusion of Si from Poly-Si to TiN in a thermal process (for example, an activation annealing process) after forming the gate electrode.

Japanese Patent Application Laid-open Publication No. 2009-099747 discloses a technology that applies WSi and TiAlN as the gate electrode of a P-type channel MOSFET. There is such description that, according to the method, TiAlN generates phase separation into TiN and AlN by performing a high temperature heat treatment because TiAlN has a poor heat resistance, and that, at this time, excessive Al diffuses into the gate insulating film through the WSi film and a dipole having an Al—O bond is formed in the gate insulating film to obtain a high work function of 4.8 eV or more.

Furthermore, Japanese Patent Application Laid-open Publication No. 2009-141040 discloses a technology applying a TiAlN film as the gate electrode of a P-type channel MOSFET. There is such description that the method can obtain a high work function of 4.8 eV or more by depositing a TiAlN film containing an Al element from 10% to 50% in a cation ratio as the gate electrode and, after that, performing a heat treatment for diffusing the Al element into the gate insulating film, based on the same phenomenon as that in Patent Document 2.

There are, however, following problems in the above-described technologies, respectively.

The technology described in Japanese Patent Application Laid-open Publication No. 2008-16538 is an effective technology in terms of realizing TiN having a high work function, and being capable of suppressing the lowering of the work function due to the diffusion of Si from Poly-Si into TiN in a thermal process after the formation of the gate electrode. In the method described in Japanese Patent Application Laid-open Publication No. 2008-16538, however, there is such a problem that the number of processes for producing the gate electrode increases because TiN having a high work function is formed by a CVD method, and then TiN capable of suppressing the diffusion of Si is formed by a PVD method. Moreover, there is such a problem in the formation method of a TiN film by a CVD method using $NH_3$ as a raw gas that the threshold voltage varies because an oxygen hole is formed in the gate insulating film by the reduction action by $NH_3$.

The methods described in Japanese Patent Application Laid-open Publication No. 2009-099747 and Japanese Patent Application Laid-open Publication No. 2009-141040 are technologies, of course, that are effective for obtaining a high work function. But, according to the methods described in Japanese Patent Application Laid-open Publication No. 2009-099747 and Japanese Patent Application Laid-open Publication No. 2009-141040, there occurs such a problem that EOT (Equivalent Oxide Thickness) (film thickness in terms of the oxide film) varies because an effective work function is controlled by the diffusion of Al into the gate insulating film. Moreover, there is such a problem that these methods do not describe a film composition optimal for a high permittivity gate insulating film or a formation method thereof.

The method described in Japanese Patent Application Laid-open Publication No. 2008-16538 is an effective technology, of course, capable of controlling the work function by the concentration of nitrogen contained in titanium nitride. But, there is such a problem that since the method described in Japanese Patent Application Laid-open Publication No. 2008-16538 uses a silicon nitride film or a silicon nitride oxide film as the gate insulating film, it does not describe the film composition or crystal orientation of a TiN film optimal for a high permittivity gate insulating film.

Furthermore, there is such a problem that the controlling method of the crystal orientation of a TiN film described in Japanese Patent Application Laid-open Publication No. 2009-099747 describes nothing about a film composition for obtaining the optimal work function.

SUMMARY OF THE INVENTION

The present invention was achieved for above-described conventional problems, and aims at improving the problems, actualizing an intended effective work function (for example, a high effective work function), and providing a metal nitride film that exhibits no variation of EOT or reduced variation of EOT, and a semiconductor device using the metal nitride film and a manufacturing method of the semiconductor device.

The following is an embodiment of the present invention achieved for attaining the purpose.

First aspect of the present invention is a metal nitride film containing Ti, Al and N, wherein a molar fraction of Ti, Al and N of the metal nitride film, expressed as (N/(Ti+Al+N)), is 0.53 or more; a molar fraction of Ti, Al and N of the metal nitride film, expressed as (Ti/(Ti+Al+N)), is 0.32 or less; and a molar fraction of Ti, Al and N of the metal nitride film, expressed as (Al/(Ti+Al+N)), is 0.15 or less.

A second aspect of the present invention is a semiconductor device comprising, on a silicon substrate, a field-effect transistor having a gate insulating film and a gate electrode provided on the gate insulating film, wherein: the gate insulating film has a high permittivity insulating film including a metal oxide, a metal silicate, a metal oxide into which nitrogen is introduced, or a metal silicate into which nitrogen is introduced, and the gate electrode contains the metal nitride film according to the first aspect of the present invention.

A third aspect of the present invention is a nonvolatile semiconductor device comprising: a substrate, at least the surface of which includes a semiconductor layer; a gate electrode formed on the substrate; and a laminated type gate insulating film laminated between the substrate and the gate electrode, wherein the gate electrode contains the metal nitride film described according to the first aspect of the present invention.

A fourth aspect of the present invention is a semiconductor device of a nonvolatile memory element comprising: a first electrode; a second electrode; and a variable resistance layer which is inserted between the first and second electrodes and varies the resistance value between two different values, wherein at least any one of the first and second electrodes contains the metal nitride film according to the first aspect of the present invention.

A fifth aspect of the present invention is a manufacturing method of a semiconductor device provided with a metal nitride film, wherein: the method comprises the step of forming the metal nitride film, and a molar fraction of Ti, Al and N of the metal nitride film, expressed as (N/(Ti+Al+N)), is 0.53 or more; a molar fraction of Ti, Al and N of the metal nitride film, expressed as (Ti/(Ti+Al+N)), is 0.32 or less; and a molar fraction of Ti, Al and N of the metal nitride film, expressed as (Al/(Ti+Al+N)), is 0.15 or less.

The present invention provides a metal nitride film containing Ti, Al and N in molar fractions such that (N/(Ti+Al+N)) is 0.53 or more, (Ti/(Ti+Al+N)) is 0.32 or less, and (Al/(Ti+Al+N)) is 0.15 or less. The setting of the molar fraction of Ti, Al and N in the above-described range can give a metal nitride film that has a high effective work function and is excellent in heat resistance. Accordingly, the use of the metal nitride film as the gate electrode of a CMOS transistor can realize the work function particularly suitable for P-type channel MOSFETs. Further, the use of the metal nitride film as the gate electrode of a nonvolatile element and as the electrode of a resistance variable element can realize the improvement in erasing characteristics and retention characteristics of the element.

DETAILED DESCRIPTION OF THE INVENTION

Hereinafter, the embodiment of the present invention will be explained in detail based on the drawings.

The present invention is based on the discony that a metal nitride film that has a high effective work function value and is excellent in thermal resistance can be obtained by setting molar fractions of Ti, Al and N in the metal nitride film containing Ti, Al and N to be such that (N/(Ti+Al+N)) is 0.53 or more, (Ti/(Ti+Al'N)) is 0.32 or less, and (Al/(Ti+Al+N)) is 0.15 or less, as a result of hard studies on a metal nitride film that satisfies both high effective work function value and thermal resistance.

Figure 1:
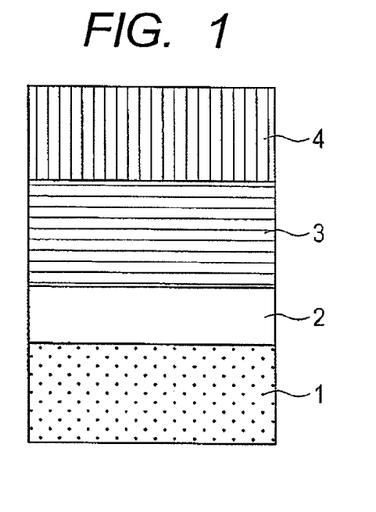
FIG. 1 is a drawing showing the cross section of an element structure according to an embodiment of the present invention.

The configuration of the metal nitride film for realizing a high work function in the present invention will be described by taking the MIS (Metalinsulator Semiconductor Structure) capacitor element in FIG. 1 as an example. As shown in FIG. 1, on a p-type silicon substrate 1 having a gate insulating film 2 using a silicon oxide film and a HfSiO film as a high permittivity film on the surface, a titanium nitride film 3 and a metal nitride film 4 are formed.

A high permittivity material to be used as the gate insulating film is a material having a relative permittivity larger than that of $SiO_2$ (3.9). Examples of the materials include a metal oxide, a metal silicate, a metal oxide into which nitrogen is introduced, and a metal silicate into which nitrogen is introduced. From the standpoint of suppressing the crystallization to improve the reliability of the element, a high permittivity film into which nitrogen is introduced is preferable. As a metal in high permittivity materials, Hf or Zr is preferable, from the standpoint of the thermal resistance of the film and the suppression of a fixed charge in the film. As the high permittivity material, a metal oxide containing Hf or Zr and furthermore Si, and a metal oxynitride additionally containing nitrogen in the metal oxide are preferable, and HfSiO and HfSiON are more preferable. Furthermore, as the gate insulating film, here, a silicon oxide film and a high permittivity film laminated thereon are used, but the insulating film is not limited to this, and a high permittivity insulating film alone, or a silicon oxynitride film and a high permittivity film laminated thereon can be used.

Figure 2:
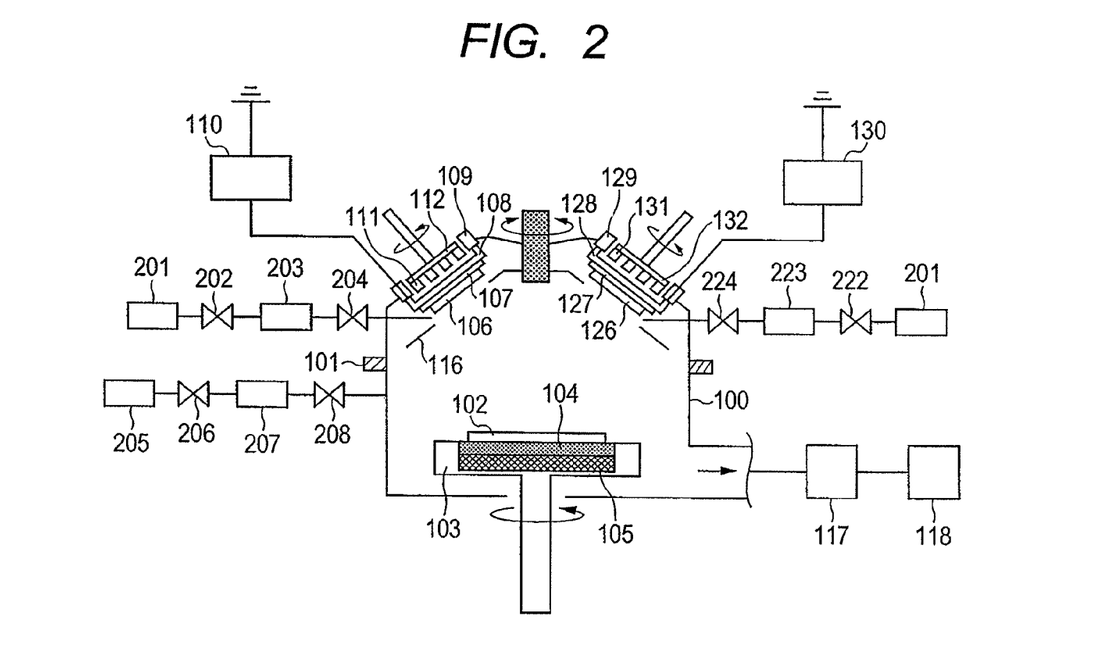
FIG. 2 is a drawing showing the outline of a treatment apparatus used for the formation process of the metal nitride film according to an embodiment of the present invention.

FIG. 2 shows the outline of the treatment apparatus to be used in the formation process of a titanium nitride film in the present invention. A film-forming treatment chamber 100 is configured so as to be heated to a prescribed temperature by a heater 101. The film-forming treatment chamber 100 is constituted so that a heater 105 can heat a substrate to be processed 102 to a prescribed temperature via a susceptor 104 built in a substrate support 103. The substrate support 103 can preferably rotate in a prescribed rotation number from the standpoint of the evenness of film thickness. In the film-forming treatment chamber 100, targets 106 and 126 are disposed at positions facing the substrate to be processed 102. Targets 106 and 126 are disposed on target holders 108 and 128 via back plates 107 and 127, respectively, made of metal such as copper. Meanwhile, the external shape of a target assembly formed by combining targets 106 and 126 with back plates 107 and 127 may be formed with a target material as one part and attached as the target. That is, a structure in which the target is disposed on the target holder is acceptable. Target holders 108 and 128 made of metal such as copper are connected with direct-current power sources 110 and 130 for applying sputtering discharge power, and are insulated from the wall of the film-forming treatment chamber 100 at the ground potential by insulators 109 and 129, respectively. Behind the targets 106 and 126 each seen from the sputtering plane, respective magnets 111 and 131 for realizing magnetron sputtering are disposed. Respective magnets 111 and 131 are held by magnet holders 112 and 132, and are configured so as to be rotatable by a magnet holder rotation mechanism (not shown). In order to make the erosion of the target uniform, magnets 111 and 131 are rotated during the discharge. Targets 106 and 126 are disposed at off-set positions obliquely above the substrate to be processed 102. That is, each central point of the sputtering planes of targets 106 and 126 is located at a position shifted in a prescribed dimension relative to the normal line of the central point of the substrate 102. Between targets 106 and 126 and the substrate to be processed 102, a shielding plate 116 is disposed to control the film-forming on the substrate to be processed 102 by sputtered particles ejected from targets 106 and 126 to which electric power is applied.

In the present embodiment, as the target, a metal target 106 of Ti and a metal target 126 of Al are used, but the target is not limited to these. For example, an alloy target containing Ti and Al may be used. The deposition of the titanium nitride film 3 is performed by applying power to metal targets 106 and 126 from direct-current power sources 110 and 130 via target holders 108 and 128 and back plates 107 and 127, respectively. At this time, inert gas is introduced into the treatment chamber 100 from an inert gas source 201 to the treatment chamber 100 at the vicinity of the targets via valves 202 and 222, mass flow controllers 203 and 223, valves 204 and 224, respectively. Further, a reactive gas containing nitrogen is introduced into the treatment chamber 100 at the vicinity of the substrate from a nitrogen gas source 205 via a valve 206, a mass flow controller 207, and a valve 208. The introduced inert gas and reactive gas are exhausted by a vacuum pump 118 via a conductance valve 117.

On the gate insulating film 2, the TiN film 3 was deposited in 1.8 nm under such conditions as substrate temperature of 30° C., Ti target power of 600 W, Ar gas as an inert gas, an Ar supply quantity of 60 sccm (Standard Cubic Centimeter per Minute), and a reactive gas supply quantity of 10 sccm. After that, a metal nitride film 4 (hereinafter, referred to as a TiAlN film) containing Ti, Al and N was formed on the TiN film 3. In the film-forming, the substrate temperature was set to be 30° C., Ti target power was set to be 600 W, and Al target power was set to be 600 W. Ar was used as an inert gas, the supply quantity of Ar was set to be 60 sccm, and the supply quantity of nitrogen being a reactive gas was set in the range of 0 sccm to 40 sccm. Meanwhile, sccm=a gas flow rate supplied per one minute, and $cm^3$ number represented in terms of 0° C. and 1 atmospheric pressure=$1.69 \times 10^{-3}$ Pa $m^3$/s (at 0° C.).

Next, by using a lithographic technology and an RIE (Reactive Ion Etching) technology, a laminated film of a TiN film 3 and the TiAlN film was processed into an intended size to form an element.

Next, the produced element was subjected to annealing treatment in a temperature range of 400° C. to 1000° C. in a nitrogen atmosphere.

The composition of the deposited TiAlN film was analyzed by X-ray Photoelectron Spectroscopy (XPS). The crystallinity of the TiAlN film was evaluated by Transmission Electron Microscopy (TEM). Electric characteristics such as the effective work function, EOT, and leak current characteristics were evaluated by C-V and I-V measurements. "The effective work function" in the present specification is one generally obtained from a flat band by the C-V measurement of the gate insulating film and the gate electrode. In addition to the original work function of the gate electrode, the effective work function is influenced by the fixed charge in the insulating film, a dipole formed at an interface, Fermi level pinning etc. It is differentiated from the original "work function" of a material constituting the gate electrode.

Figure 3:
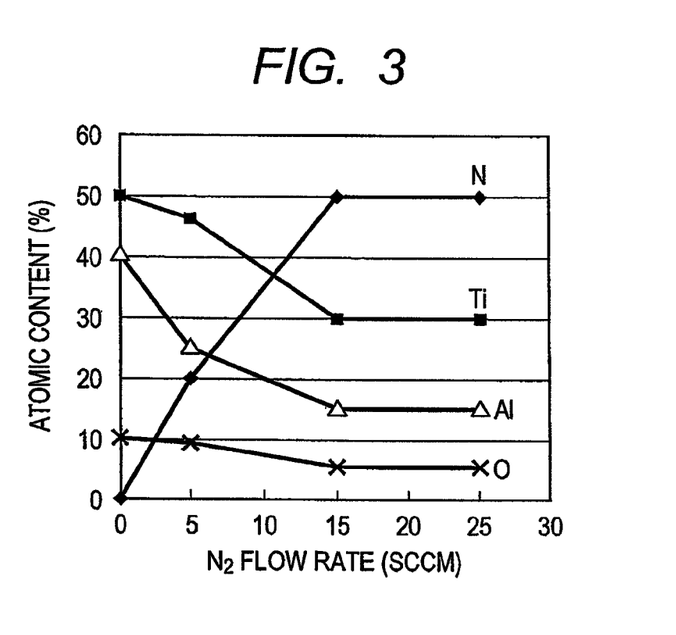
FIG. 3 is a drawing showing the relation between the film composition of the metal nitride film and the nitrogen flow rate according to an embodiment of the present invention.

FIG. 3 shows the relation between the composition of the TiAlN film and the nitrogen flow rate at the film-forming, in the present invention. Meanwhile, the drawing also shows values concerning oxygen in the film, which is due to the oxidation resulted from the exposure to air. The film composition in the present specification is described by components excluding the oxygen. As shown in the drawing, it can be confirmed that, in a region in which the nitrogen flow rate is 15 sccm or more, the TiAlN film has such molar fractions as (N/(Ti+Al+N)) of 0.53, (Ti/(Ti+Al+N)) of 0.32, and (Al/(Ti+Al+N)) of 0.15. Further, as the result of the evaluation of the crystallinity of the TiAlN film by TEM, it was confirmed that the film had an amorphous structure in the as-deposited condition in the nitrogen flow rate region of 5 sccm or less when forming the TiAlN film, and that the film was crystallized in the as-deposited condition in the nitrogen flow rate region of 15 sccm or more when forming the TiAlN film. And, as the result of evaluating the relation between the flow rate of nitrogen being a reactive gas and the sputtering ratio of Ti and Al targets, it was confirmed that the region in which the nitrogen flow rate was 15 sccm or more was a region in which the lowering rate of the sputtering rate caused by the nitridation of the target surface became maximum.

Figure 4:
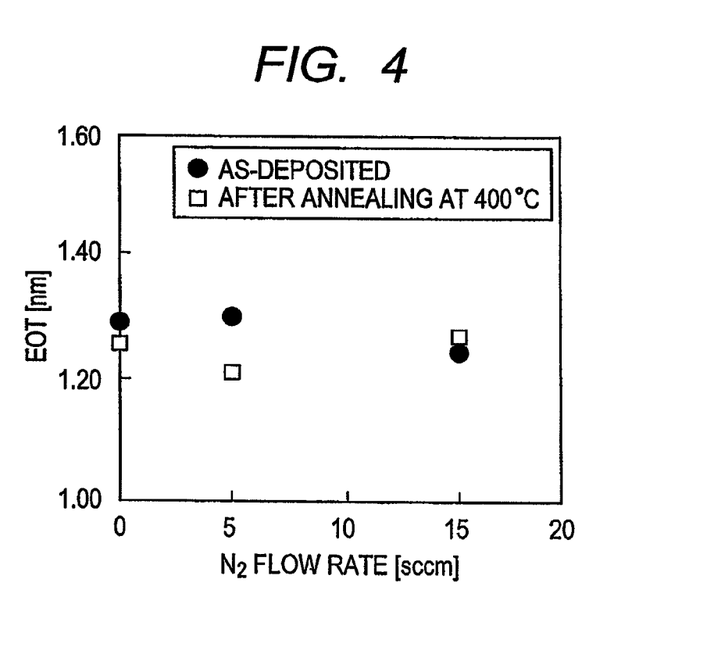
FIG. 4 is a drawing showing the relation between the EOT of an element and the nitrogen flow rate according to an embodiment of the present invention.
Figure 5:
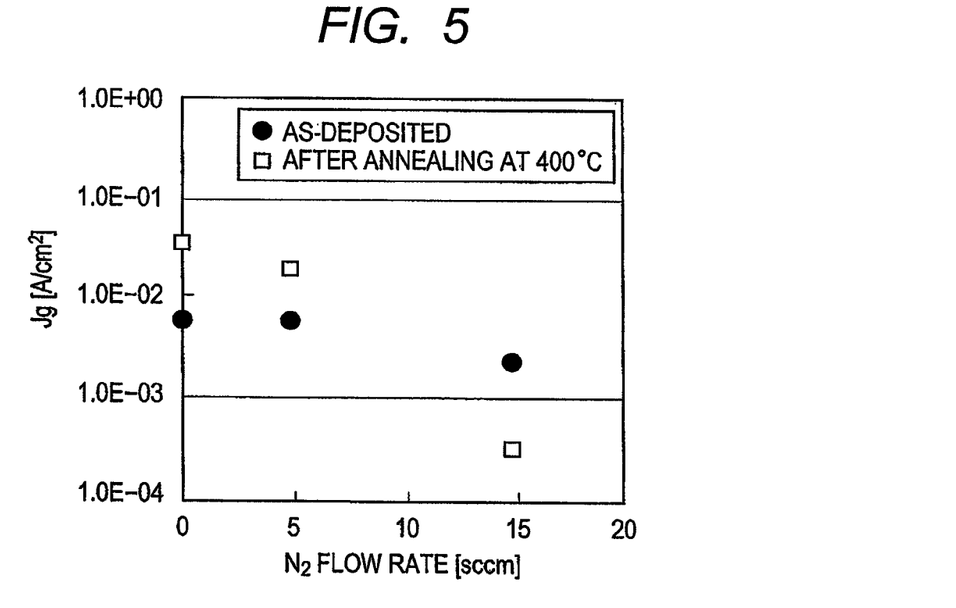
FIG. 5 is a drawing showing the relation between the leak current value of an element and the nitrogen flow rate according to an embodiment of the present invention.
Figure 6:
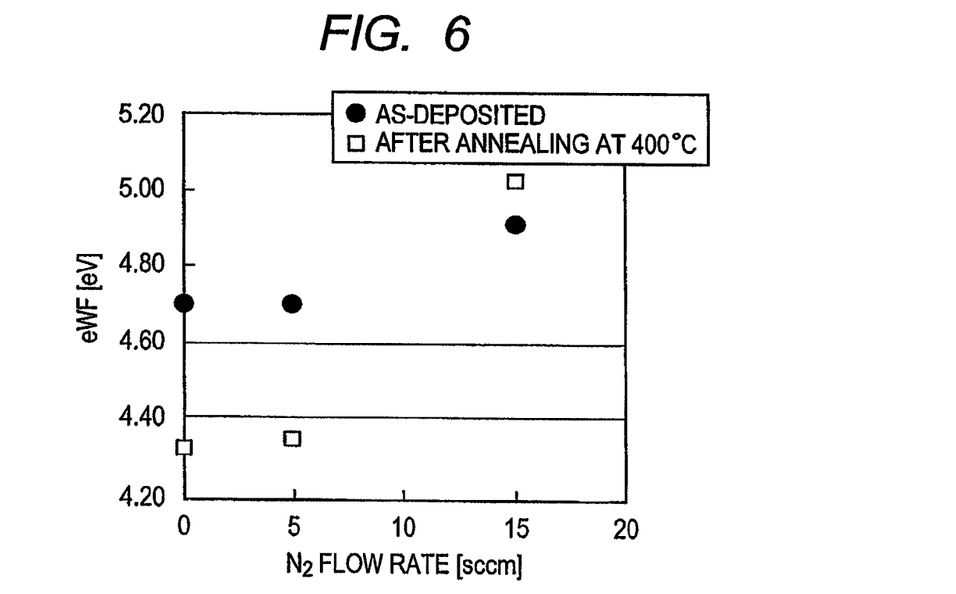
FIG. 6 is a drawing showing the relation between the effective work function value of an element and the nitrogen flow rate according to an embodiment of the present invention.

FIGS. 4 to 6 show results of measurements of electric characteristics of elements produced by varying the nitrogen flow rate when forming TiAlN. Here, electric characteristics were evaluated in the as-deposited condition and in the condition after an annealing treatment at 400° C. Meanwhile, the "as-deposited condition" means the condition when the TiAlN film has been formed. FIG. 4 shows the relation between EOT and the nitrogen flow rate when forming TiAlN. The drawing shows that EOT is about 1.3 nm, without showing a large change regardless of the difference in the nitrogen flow rate, or of the absence or presence of the annealing treatment. Next, FIG. 5 shows the relation between the leak current (Jg) and the nitrogen flow rate when forming TiAlN. From the drawing, it can be confirmed that the leak current value of elements having a TiAlN electrode formed under the condition of the nitrogen flow rate of 0 sccm or 5 sccm increases by about one order of magnitude by the annealing treatment, and that, in contrast, the leak current value of an element having a TiAlN electrode formed under the condition of the nitrogen flow rate of 15 sccm decreases by about one order of magnitude by the annealing treatment. Next, FIG. 6 shows the relation between the effective work function value (eWF) and the nitrogen flow rate when forming TiAlN. As shown in the drawing, when comparing effective work functions of elements in the as-deposited condition, elements having a TiAlN electrode formed under the condition of the nitrogen flow rate of 0 sccm or 5 sccm show the effective work function of 4.7 eV, but, in contrast, an element having a TiAlN electrode formed under the condition of the nitrogen flow rate of 15 sccm shows a higher value of 4.9 eV. Furthermore, when comparing effective work functions of elements having been subjected to the annealing treatment at 400° C., it can be seen that the effective work function of elements having a TiAlN electrode formed under the condition of the nitrogen flow rate of 0 sccm or 5 sccm lowers largely to 4.3 eV as compared with that in the as-deposited condition, but that an element having a TiAlN electrode formed under the condition of the nitrogen flow rate of 15 sccm maintains a high value of 5.0 eV or more even after the annealing treatment.

From the above description, it is considered that, in the element having TiAlN that is formed under the condition of the nitrogen flow rate of 5 sccm or less and has such molar fractions as (N/(Ti+Al+N))<0.53, (Ti/(Ti+Al+N))>0.32, and (Al/(Ti+Al+N))>0.15, Al contained in the TiAlN film diffuses into the TiN film and insulating film in the lower part, because the increase in the leak current and the decrease in the effective work function by the annealing treatment are observed. On the other hand, it is considered that, in the element having TiAlN that is formed under the condition of the nitrogen flow rate of 15 sccm and has such molar fractions as (N/(Ti+Al+N))=0.53, (Ti/(Ti+Al+N))=0.32, and (Al/(Ti+Al+N))=0.15, the diffusion of Al by the annealing treatment is suppressed, because a high effective work function value is maintained without the increase in the leak current. Accordingly, it is shown that the TiAlN film in the present invention has such an effect as capable of maintaining a high effective work function without causing the increase in the leak current even when it is subjected to the annealing treatment. Here, the TiAlN film having such molar fractions of Ti, Al and N contained in the film as (N/(Ti+Al+N))=0.53, (Ti/(Ti+Al+N))=0.32 and (Al/(Ti+Al+N))=0.15 is used, but the film is not limited to this. In the present invention, when molar fractions of Ti, Al and N lie in such ranges as (N/(Ti+Al+N))≤0.53, (Ti/(Ti+Al+N))≤0.32, and (Al/(Ti+Al+N))≤0.15, the effect can sufficiently be exerted. Further, here, the laminated film of TiN and TiAlN is used, but this is not the only candidate, and the use of a laminate of TiAlN, W and WN, a laminate of TiAlN and Si, and a single layer film of TiAlN can also exert a sufficient effect.

Figure 7:
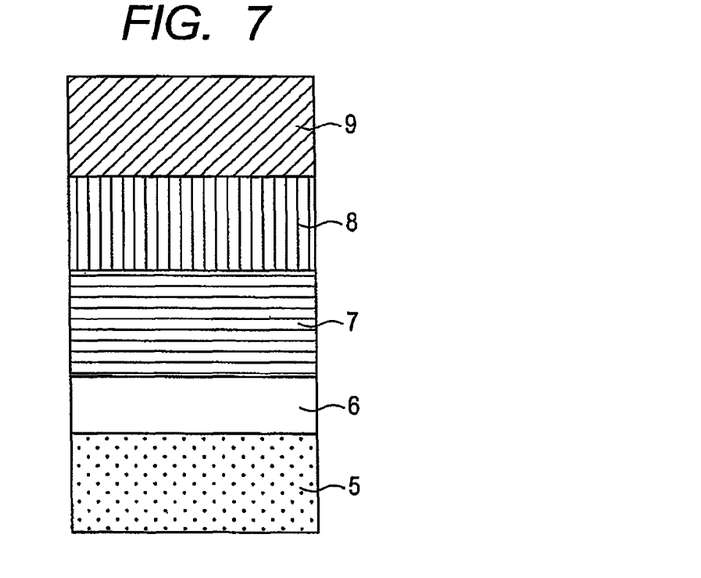
FIG. 7 is a drawing showing the cross-section of an element structure according to an embodiment of the present invention.

Next, the effect of the TiAlN film of the present invention in an element having a MIPS (Metal-inserted Poly-silicon Stack) structure in FIG. 7 will be explained. The element in FIG. 7 is an element formed by sequentially depositing a titanium nitride film 7, a TiAlN film 8 and a silicon film 9 on a p-type silicon substrate 5 having, on the surface thereof, a gate insulating film 6 using a silicon oxide film and a HfSiO film as a high permittivity film. The element shown in FIG. 7 differs, as compared with the element shown in FIG. 2, in that it has the silicon film 9 deposited on the TiAlN 8 in the above-described element. The silicon film 9 is formed by a PVD method or a CVD method in 20 nm. As the TiAlN film 8, a film having such molar fractions as (N/(Ti+Al+N))=0.53, (Ti/(Ti+Al+N))=0.32, and (Al/(Ti+Al+N))=0.15 was used. The molar fraction of the TiAlN film 8 and manufacturing processes except for the formation process of the silicon film are the same as those in the element in FIG. 1. For comparison, an element into which the TiAlN film 8 was not inserted was produced.

Figure 8:
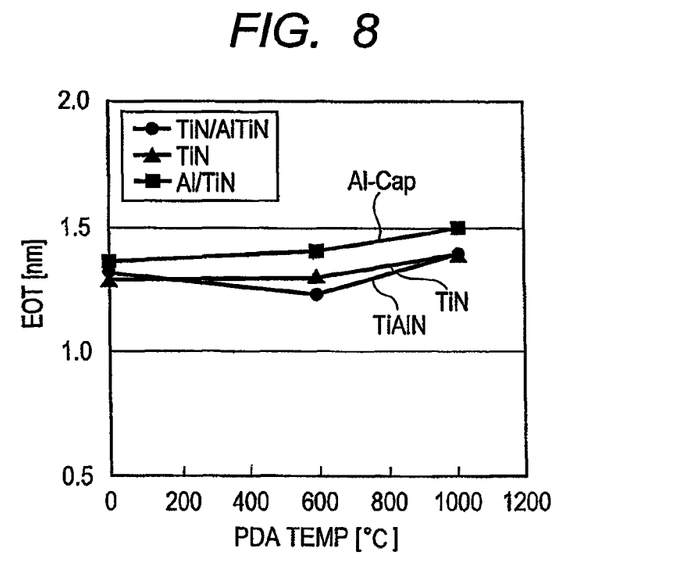
FIG. 8 is a drawing showing the relation between the EOT of an element according to an embodiment of the present invention and the annealing temperature.
Figure 9:
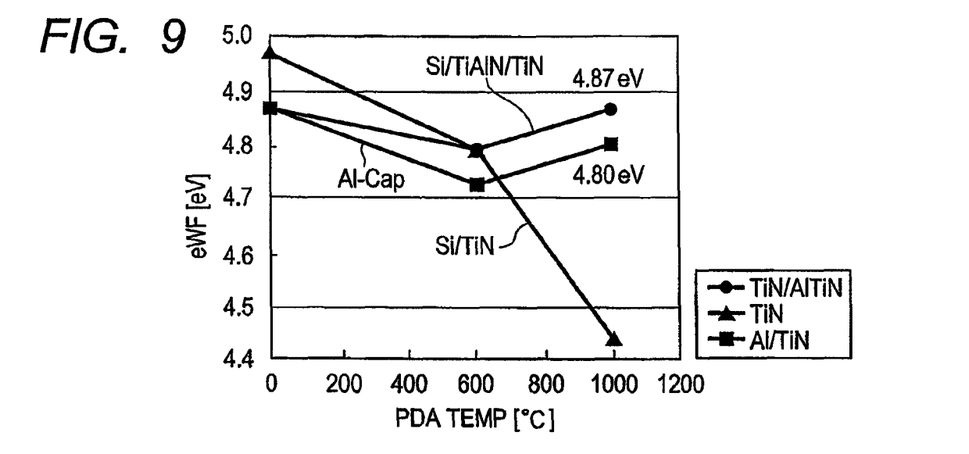
FIG. 9 is a drawing showing the relation between the effective work function value of an element and the annealing temperature according to an embodiment of the present invention.

FIGS. 8 and 9 shows results of evaluating the relation between the electric characteristics and the annealing temperature of produced elements. Each of symbols ○ and □ in the drawings shows the characteristics of an element having an electrode constituted by the laminated film of Si/TiAlN/TiN. Here, the symbol □ shows the characteristics of an element having a laminated layer of Si/TiN provided with an Al cap layer. The symbol Δ in the drawing shows the characteristics of an element having an electrode constituted by a Si/TiN film. FIG. 8 shows the relation between EOT and the annealing temperature. From the drawing, it can be confirmed that, in the element having a laminated film of Al/TiN, EOT increases by the annealing treatment, but, in contrast, in elements having the laminated film of Si/TiAlN/TiN or Si/TiN, there is little change of EOT with the change of the annealing temperature. It is considered that the increase in EOT in the element having the laminate film of Al/TiN is due to the diffusion of Al into the gate insulating film by the annealing treatment.

Next, FIG. 9 shows the relation between the effective work function and the annealing temperature. The symbol ○ in the drawing shows the characteristics of an element having the electrode constituted by the laminated film of Si/TiAlN/TiN. The symbol □ shows the characteristics of an element having the laminated film of Si/TiN provided with an Al cap layer.

The symbol Δ in the drawing shows the characteristics of an element having an electrode constituted by the Si/TiN film. From the drawing, in the case of the element having the electrode constituted by Si/TiN, the effective work function value lowers down to 4.45 eV with the increase in the annealing temperature, but, in contrast, in the case of the element having the electrode constituted by Si/TiAlN/TiN, it maintains a high value of about 4.9 eV even when an annealing at 1000° C. is provided. The leak current value at this time shows $5.7 \times 10^{-4}$ A/cm$^2$, and the deterioration of the leak current value can not be confirmed.

In the case of the laminated film of Si/TiN shown by symbol Δ in FIG. 9, it is considered that the annealing treatment causes Si to diffuse into the TiN film to reduce the effective work function. On the other hand, in the case of the laminated film of Si/TiAlN/TiN, it is considered that the TiAlN film functions as a barrier film for suppressing the diffusion of Si and, therefore, a high effective work function can be maintained even after the annealing treatment. Accordingly, it is shown that the TiAlN film in the present invention has a barrier function for suppressing not only the diffusion of Al into a underlayer, but also the diffusion of Si from the silicon film on the TiAlN film. Here, the TiAlN film containing constituents of Ti, Al and N in such moral ratios as (N/(Ti+Al+N))=0.53, (Ti/(Ti+Al+N))=0.32, and (Al/(Ti+Al+N))=0.15 is explained, but this is not the only candidate, and films having molar fractions within such ranges as (N/(Ti+Al+N))≤0.53, (Ti/(Ti+Al+N))≤0.32, (Al/(Ti+Al+N))≤0.15 can sufficiently exert the effect. Further, the laminated film of TiN and TiAlN is used here, but the TiAlN film used in a single layer can sufficiently exert the effect, too.

As described above, by setting molar fractions of the metal nitride film containing Ti, Al and N in the present invention in such ranges as (N/(Ti+Al+N))≤0.53, (Ti/(Ti+Al+N))≤0.32, and (Al/(Ti+Al+N))≤0.15, it becomes possible to improve the thermal resistance of the element, and to obtain a high work function without causing the increase in the leak current resulting from the annealing treatment. Accordingly, for example, when the film is used as the gate electrode in a semiconductor device provided with a field-effect transistor having the gate insulating film and the gate electrode provided on the gate insulating film on a silicon substrate, a high effective work function suitable for P-type channel type MOSFETs can be realized.

Moreover, when it is applied to N-type channel type MOSFETs, by applying metal nitride film of the present invention to a part of the gate electrode on a gate insulating film constituted by a high permittivity film containing a silicon oxide film or silicon nitride film, La, and Hf or Zr, a low effective work function can be actualized.

Moreover, by applying the metal nitride film of the present invention capable of actualizing a high effective work function to a part of the gate electrode of nonvolatile semiconductor devices having a laminated-type gate insulating film formed by sequential lamination between a semiconductor substrate and the gate electrode, erasing characteristics and retention characteristics can be improved.

Furthermore, in nonvolatile memory elements having a variable resistance layer having two resistance values changing between these (a variable resistance layer in which the resistance value changes to two different values) inserted between a first and second electrodes, by applying the metal nitride film of the present invention capable of realizing a high barrier function to a part of at least one of the first and second electrodes, the diffusion of oxygen from the variable resistance layer can be suppressed to actualize the improvement of the rewriting resistance.

Example 1

<P-Channel Type MOSFET>

A first Example of the present invention will be explained in detail with reference to the drawings.

Figure 10A:
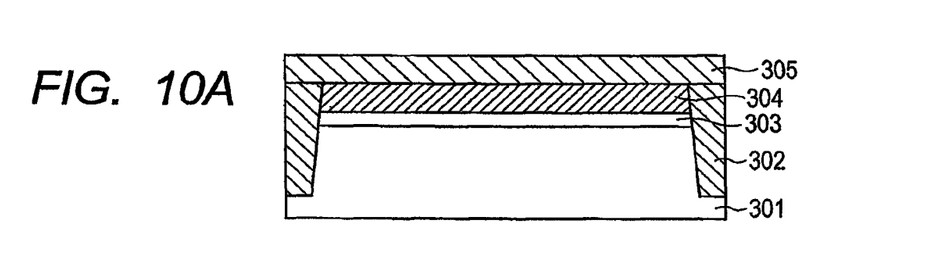
FIG. 10A is a drawing showing the process of the manufacturing method of the semiconductor device in Example 1 of the present invention.
Figure 10B:
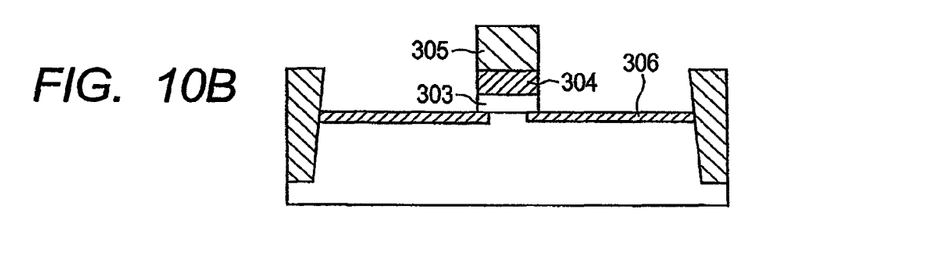
FIG. 10B is a drawing showing the process of the manufacturing method of the semiconductor device in Example 1 of the present invention.
Figure 10C:
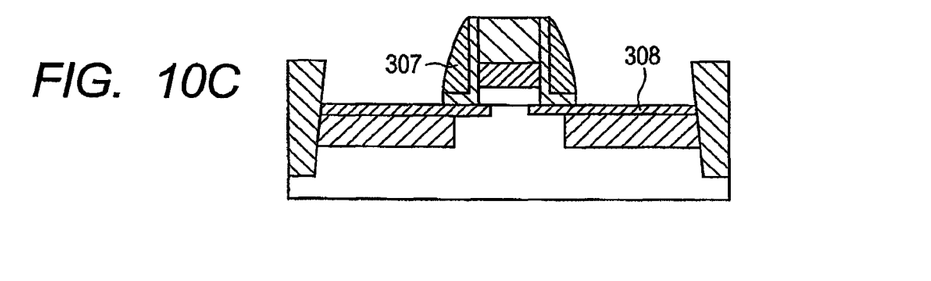
FIG. 10C is a drawing showing the process of the manufacturing method of the semiconductor device in Example 1 of the present invention.

FIGS. 10A to 10C are drawings showing the process of the manufacturing method of a semiconductor device being the first Example of the present invention. Firstly, as shown in FIG. 10A, an element isolation region 302 formed by an STI (Shallow Trench Isolation) technology was provided on the surface of a silicon substrate 301. Subsequently, on the element-isolated silicon substrate surface, a thermally-oxidized film of silicon having a thickness of 1.0 nm was formed by a thermal oxidization method. After that, a Hf film having a thickness of 0.5 to 0.7 nm was deposited by a sputtering method. After that, an annealing treatment at 900° C. for 1 minute was performed in an atmosphere having an oxygen partial pressure of 0.1 Pa to cause Hf to diffuse into the silicon oxide film, thereby forming a gate insulating film 303 constituted by the laminate structure of the silicon oxide film and a HfSiO film.

Next, in the treatment apparatus shown in FIG. 2, the TiAlN film was' deposited in 10 nm as a metal nitride layer 304, which had molar fractions of Ti, Al and N in such ranges as (N/(Ti+Al+N))≥0.53, (Ti/(Ti+Al+N))≤0.32, and (Al/(Ti+Al+N))≤0.15 by using a Ti metal target and adjusting the mixing ratio of an argon gas flow rate and an nitrogen gas flow rate.

Next, a silicon layer 305 having a thickness of 20 nm was formed, which was then processed into the gate electrode by using a lithographic technology and RIE technology as shown in FIG. 10B. Subsequently, ion implantation was performed to form self-alignedly an extension diffusion region 306 using the gate electrode as a mask.

Further, as shown in FIG. 10C, a silicon nitride film and a silicon oxide film were sequentially deposited, which were then etched back to form a gate side wall 307. In this condition, an ion implantation was performed again and, through an activating annealing, a source/drain diffusion layer 308 was formed.

As the result of evaluating electric characteristics of the produced element, it was confirmed that an effective work function suitable for P-type MOSFETs (4.9 eV or more) was able to be obtained without the deterioration of EOT and leak current.

Moreover, it was confirmed that a HfSiO film deposited by a CVD method as the gate insulating film was able to produce the same effect, too.

Furthermore, it was confirmed that when a HfSiON film formed by depositing HfSiO and then subjecting the same to a radical nitridation treatment was used as the gate insulating film, the same effect was also able to be obtained.

Furthermore, it was confirmed that the same effect was obtained when a material containing Zr selected from the group consisting of ZrSiO, ZrSiON, HfZrSiO and HfZrSiON was used as the gate insulating film.

As described above, it was confirmed that the effect of the present invention was obtained in MOSFET elements, too, constituted by the MIPS-type gate electrode in the Example 1.

Furthermore, it was confirmed that the same effect was obtained even when a laminated film of TiN as the gate electrode, at least one film selected from W and WN, and a TiAlN film was used.

Example 2

<Nonvolatile Memory>

Figure 11A:
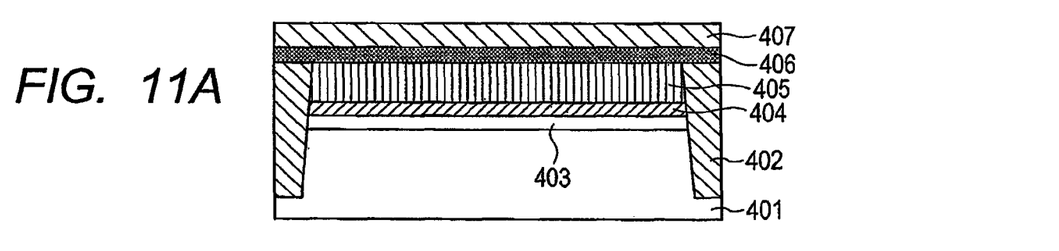
FIG. 11A is a drawing showing the process of the manufacturing method of the semiconductor device in Example 2 of the present invention.
Figure 11B:
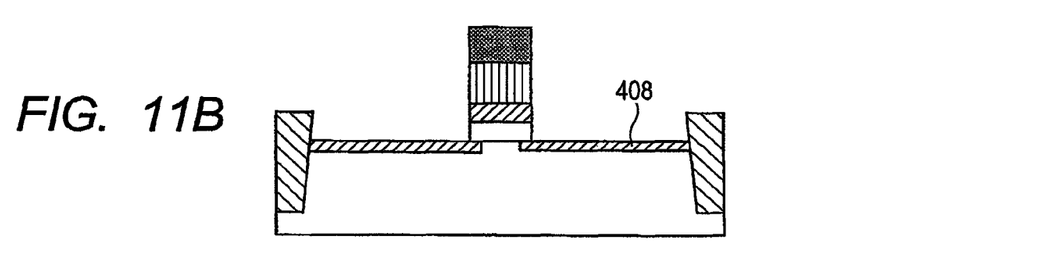
FIG. 11B is a drawing showing the process of the manufacturing method of the semiconductor device in Example 2 of the present invention.
Figure 11C:
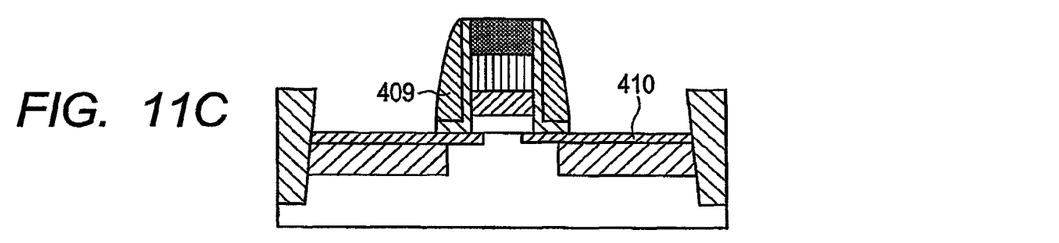
FIG. 11C is a drawing showing the process of the manufacturing method of the semiconductor device in Example 2 of the present invention.

FIGS. 11A to 11C are cross-sectional views showing the production process of a semiconductor element according to a second Example of the present invention.

First, as shown in FIG. 11A, an element isolation layer 402 was formed on the surface of a silicon substrate 401 by using an STI (Shallow Trench Isolation) technology. Subsequently, on the surface of the element-isolated silicon substrate, a silicon oxide film 403 was formed in 30 Å to 100 Å by a thermal film oxidization method. Subsequently, as a second insulating film, a silicon nitride film 404 was formed in 30 Å to 100 Å by an LPCVD (Low Pressure Chemical Vapor Deposition) method. Subsequently, as a third insulating film, an aluminum oxide film 405 was formed in 200 Å. The aluminum oxide film may be formed using an MOCVD method, an ALD (Atomic Layer Deposition) method, or a PVD (Physical Vapor Deposition) method. Next, as the gate electrode, the TiAlN film as a metal nitride layer 406 having molar fractions of Ti, Al and N in such ranges as (N/(Ti+Al+N))≥0.53, (Ti/(Ti+Al+N))≤0.32 and (Al/(Ti+Al+N))≤0.15 was deposited in 10 nm using the same method as that in Example 1.

After that, a Poly-Si film 407 having a thickness of 150 nm was formed, and the resulting product was then processed into the gate electrode by using a lithographic technology and RIE (Reactive Ion Etching) technology, as shown in FIG. 11B and, continuously, the ion implantation was performed to form an extension diffusion region 408 self-alignedly by using the gate electrode as a mask. Further, as shown in FIG. 11C, a silicon nitride film and a silicon oxide film were sequentially deposited, which were then etched back to form a gate side wall 409. The ion implantation was performed again in this condition, and, through an activation annealing, a source/drain diffusion layer 410 was formed. As the result of evaluating the erasing characteristics of the produced nonvolatile semiconductor element, the improvement of the erasing speed caused by the increase in the effective work function was confirmed.

As described above, it was confirmed that the effect of the present invention was also able to be obtained in a nonvolatile semiconductor element having the laminated-type insulating film in the present embodiment, too.

Further, it was confirmed that the same effect was obtained when a laminated film of TiN as the gate electrode, at least one film selected from W and WN, and a TiAlN film was used.

Example 3

<ReRAM>

A third Example of the present invention will be explained in detail with reference to the drawings.

Figure 12:
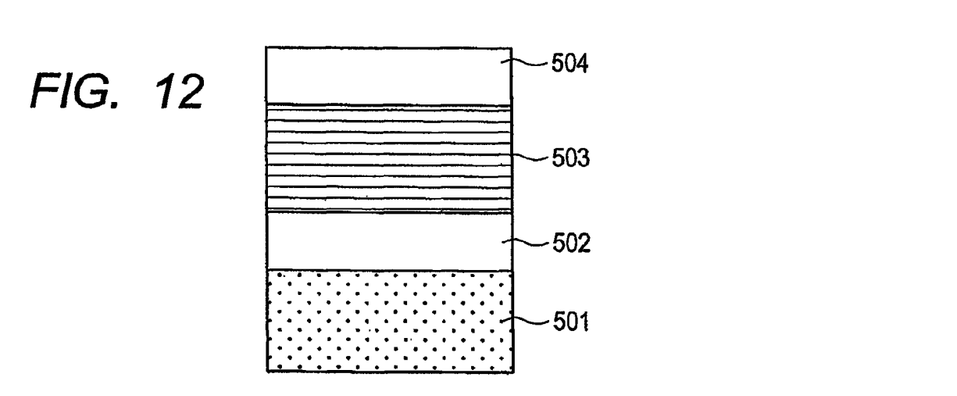
FIG. 12 is a drawing showing the process of the manufacturing method of the semiconductor device in Example 3 of the present invention.

FIG. 12 shows the outline of the cross section of an element structure according to Example 3. In the treatment apparatus shown in FIG. 2, a TiAlN film 502 was deposited in 10 nm, which had molar fractions of Ti, Al and N in such ranges as (N/(Ti+Al+N))≥0.53, (Ti/(Ti+Al+N))≤0.32, and (Al/(Ti+Al+N))≤0.15, on a silicon substrate 501 having a silicon oxide film in the thickness of 100 nm on the surface by using a Ti metal target and adjusting the mixing ratio of an argon gas flow rate and a nitrogen gas flow rate.

Next, a laminated film constituted by Al and Hf (Al=5 nm/Hf=20 nm/Al=5 nm) was deposited. After that, an annealing treatment at 500° C. for 10 minutes in a nitrogen atmosphere and an annealing treatment at 500° C. for 30 minutes in an oxygen atmosphere were performed to thereby form a variable resistance layer 503 constituted by a metal oxide containing Hf and Al.

Next, on the variable resistance layer 503, a TiAlN film 504 was deposited by the same method as that of TiAlN film 502.

Next, the TiAlN film was processed into an intended size by using the lithographic technology and RIE (Reactive Ion Etching) technology.

As the result of evaluating the durability (endurance characteristics) of the resistance variation phenomenon by applying plus and minus pulses (shown in the drawing) alternately and continuously to the produced resistance variable element, there was found no lowering of the resistance variation ratio due to the oxidation of the electrode.

As described above, it was confirmed that the effect of the present invention was also able to be obtained in the variable resistance type nonvolatile semiconductor element according to the present embodiment.

In the above Example, the method, in which the metal laminated film of Hf and Al was used for forming the variable resistance layer, was described. In addition, it was confirmed that the same effect as that in the above Example was also able to be obtained when a method, in which a metal film containing Hf and Al was deposited by using the co-sputtering of a Hf target and an Al target and, after that, an annealing treatment at 300° C. to 600° C. was performed in an oxygen atmosphere, was used in the formation process of the variable resistance layer. Moreover, it was confirmed that the same effect as that in the above Example was also able to be obtained when a process, in which magnetron sputtering was performed under a mixed atmosphere of the Hf target, Al target, a reactive gas containing oxygen and an inert gas, was used as the formation process of the variable resistance layer.

Further, in the above Example, the instance was described, in which the metal oxide containing Hf and Al was used as the variable resistance layer material. In addition, it was confirmed that the same effect as that in the above Example was also able to be obtained when a metal oxide film of at least one metal selected from Ni, Ti, Ta, Hf, Zr, V, Zn, Nb, W and Co, or a laminated film thereof was used as the variable resistance layer.

Furthermore, it was confirmed that a resistance variable element that gave the same effect was also able to be formed when a metal film of at least one metal selected from Ni, Ti, Ta, Hf, Zr, V, Zn, Nb, W and Co, or a laminated film thereof was deposited and then an annealing treatment at 300° C. to 600° C. was performed in an oxygen atmosphere as the formation process of the variable resistance layer. Furthermore, it was confirmed that the same effect as that in the above Example was also able to be obtained when a process, in which at least one metal target selected from Ni, Ti, Ta, Hf, Zr, V, Zn, Nb, W and Co was subjected to magnetron sputtering under a mixed atmosphere of a reactive gas constituted by oxygen and an inert gas, was used as the formation process of the variable resistance layer.

What is claimed is:

1. A semiconductor device comprising:
a silicon substrate;
a gate insulating film provided on the silicon substrate; and
a gate electrode provided on the gate insulating film,
wherein the insulating film is a high permittivity insulating film including a metal oxide, a metal silicate, a metal oxide into which nitrogen is introduced, or a metal silicate into which nitrogen is introduced,
the gate electrode has: a metal-containing layer containing at least one selected from TiN, WN, and Si provided on the gate insulating film, the metal-containing layer not being a film composed of WSi; a metal nitride layer containing Ti, Al, and N provided on the metal-containing layer; and a silicon layer provided on the metal nitride layer, and a molar fraction of Ti, Al, and N of the metal nitride layer, expressed as (N/(Ti+Al+N)), is 0.53 or more a molar fraction of Ti, Al, and N of the metal nitride layer, expressed as (Ti/(Ti+Al+N)), is 0.32 or less; and a molar fraction of Ti, Al, and N of the metal nitride layer, expressed as (Al/(Ti+Al+N)), is 0.15 or less.

2. The semiconductor device according to claim 1, wherein the semiconductor device is a field-effect transistor.

3. The semiconductor device according to claim 2, wherein the field-effect transistor is a P-type MOSFET.

4. The semiconductor device according to claim 1, wherein the silicon substrate is a substrate, at least the surface of which includes a semiconductor layer, and the gate insulating film is a laminated-type gate insulating film.

5. The semiconductor device according to claim 1, wherein an effective work function of the semiconductor device is 4.9 eV or more after an annealing of the semiconductor device.

6. A manufacturing method of a semiconductor device comprising the steps of:

forming a gate insulating film on a silicon substrate;
forming a gate electrode on the gate insulating film; and
annealing the formed gate electrode,
wherein the step of forming the gate insulating film includes a step of forming a high permittivity insulating film including a metal oxide, a metal silicate, a metal oxide into which nitrogen is introduced, or a metal silicate into which nitrogen is introduced,
the step of forming the gate electrode includes: a step of forming a metal-containing layer containing at least one selected from TiN, WN, and Si on the gate insulating film, the metal-containing layer not being a film composed of WSi; a step of forming a metal nitride layer containing Ti, Al, and N on the metal-containing layer; and a step of forming a silicon layer on the metal nitride layer, and a molar fraction of Ti, Al, and N of the metal nitride layer, expressed as (N/(Ti+Al+N)), is 0.53 or more a molar fraction of Ti, Al, and N of the metal nitride layer, expressed as (Ti/(Ti+Al+N)), is 0.32 or less; and a molar fraction of Ti, Al, and N of the metal nitride layer, expressed as (Al/(Ti+Al+N)), is 0.15 or less.

7. The manufacturing method of a semiconductor device according to claim 6, wherein the step of forming the metal nitride film is a step of magnetron-sputtering a Ti target and an Al target, or an alloy target containing Ti and Al under a mixed atmosphere of a reactive gas containing nitrogen and an inert gas in a vacuum chamber.

8. The manufacturing method of a semiconductor device according to claim 6, wherein a supply quantity of the reactive gas is set to be equal to or more than a supply quantity that provides a maximum lowering rate of a sputtering rate caused by nitridation of the surface of the Ti and Al targets, or the alloy target.

9. The manufacturing method of a semiconductor device according to claim 8, wherein the reactive gas is $N_2$, and the supply quantity of the reactive gas is 15 sccm or more.

10. The manufacturing method of a semiconductor device according to claim 6, wherein an effective work function of the semiconductor device is 4.9 eV or more after an annealing of the semiconductor device.

* * * * *